United States Patent
Jin et al.

(10) Patent No.: US 8,612,843 B2
(45) Date of Patent: Dec. 17, 2013

(54) SYSTEMS AND METHODS FOR QUALITATIVE MEDIA DEFECT DETERMINATION

(75) Inventors: Ming Jin, Fremont, CA (US); Haitao Xia, San Jose, CA (US); Lei Chen, Santa Clara, CA (US)

(73) Assignee: LSI Corporation, San Jose, CA (US)

( * ) Notice: Subject to any disclaimer, the term of this patent is extended or adjusted under 35 U.S.C. 154(b) by 160 days.

(21) Appl. No.: 13/213,789

(22) Filed: Aug. 19, 2011

(65) Prior Publication Data

US 2013/0047058 A1    Feb. 21, 2013

(51) Int. Cl.
*G06F 7/02* (2006.01)

(52) U.S. Cl.
USPC .............................. 714/819; 714/723; 714/797

(58) Field of Classification Search
USPC .......... 714/819, 723, 718, 797, 710, 711, 805
See application file for complete search history.

(56) References Cited

U.S. PATENT DOCUMENTS

| | | | |
|---|---|---|---|
| 4,941,139 A * | 7/1990 | Kulakowski et al. ...... 369/53.36 |
| 5,018,126 A * | 5/1991 | Kulakowski et al. ...... 369/53.36 |
| 5,802,069 A | 9/1998 | Coulson |
| 6,065,149 A | 5/2000 | Yamanaka |
| 6,301,679 B1 | 10/2001 | Tan |
| 6,557,113 B1 | 4/2003 | Wallentine |
| 6,691,263 B2 | 2/2004 | Vasic et al. |
| 6,697,977 B2 | 2/2004 | Ozaki |
| 6,738,948 B2 | 5/2004 | Dinc et al. |
| 6,980,382 B2 | 12/2005 | Hirano et al. |
| 7,154,936 B2 | 12/2006 | Bjerke et al. |
| 7,168,030 B2 | 1/2007 | Ariyoshi |
| 7,181,059 B2 * | 2/2007 | Duvdevani et al. ........... 382/149 |
| 7,187,638 B2 * | 3/2007 | Tsai et al. .................. 369/53.32 |
| 7,203,015 B2 | 4/2007 | Sakai et al. |
| 7,237,173 B2 | 6/2007 | Morita et al. |
| 7,254,192 B2 | 8/2007 | Onggosanusi |
| 7,257,172 B2 | 8/2007 | Okamoto et al. |
| 7,359,313 B2 | 4/2008 | Chan et al. |
| 7,441,174 B2 | 10/2008 | Li et al. |
| 7,652,966 B2 | 1/2010 | Kadokawa |
| 7,688,915 B2 | 3/2010 | Tanrikulu et al. |

(Continued)

FOREIGN PATENT DOCUMENTS

| | | |
|---|---|---|
| EP | 0549151 | 5/2001 |
| JP | 10-145243 | 5/1998 |
| JP | 2007-087529 | 4/2007 |

OTHER PUBLICATIONS

U.S. Appl. No. 12/399,679, filed Mar. 6, 2009, Weijun Tan.

(Continued)

*Primary Examiner* — Fritz Alphonse
(74) *Attorney, Agent, or Firm* — Hamilton DeSanctis & Cha

(57) ABSTRACT

Various embodiments of the present invention provide systems and methods for data processing. As an example, a data processing circuit is disclosed that includes a media defect detector circuit. The media defect detector circuit is operable to compare a data input derived from a medium against at least a first defect level to yield a first level output, and a second defect level to yield a second level output; and provide a combination of the first level output and the second level output as a defect quality output. A value of the defect quality output corresponds to a likelihood of a defect of the medium.

20 Claims, 6 Drawing Sheets

(56) References Cited

U.S. PATENT DOCUMENTS

| | | | |
|---|---|---|---|
| 8,054,711 B2 * | 11/2011 | Laake | 367/45 |
| 8,149,748 B2 * | 4/2012 | Bata et al. | 370/311 |
| 8,219,892 B2 * | 7/2012 | Tan et al. | 714/780 |
| 2003/0063405 A1 | 4/2003 | Jin et al. | |
| 2006/0044978 A1 | 3/2006 | Oh | |
| 2007/0061687 A1 | 3/2007 | Hwang | |
| 2007/0242580 A1 | 10/2007 | Kikugawa et al. | |
| 2008/0168315 A1 | 7/2008 | Mead | |
| 2009/0235116 A1 | 9/2009 | Tan et al. | |
| 2009/0235146 A1 | 9/2009 | Tan et al. | |
| 2009/0268575 A1 | 10/2009 | Tan et al. | |
| 2009/0268848 A1 | 10/2009 | Tan et al. | |
| 2009/0271670 A1 | 10/2009 | Tan et al. | |
| 2010/0042877 A1 | 2/2010 | Tan | |
| 2010/0074078 A1 | 3/2010 | Cao et al. | |
| 2010/0115209 A1 | 5/2010 | Lee et al. | |
| 2010/0226031 A1 | 9/2010 | Dziak | |
| 2010/0226033 A1 | 9/2010 | Tan et al. | |
| 2010/0229031 A1 | 9/2010 | Tan et al. | |

OTHER PUBLICATIONS

U.S. Appl. No. 12/399,713, filed Mar. 6, 2009, Weijun Tan.
U.S. Appl. No. 12/399,750, filed Mar. 6, 2009, Weijun Tan.
U.S. Appl. No. 12/425,626, filed Apr. 17, 2009, Yang et al.
U.S. Appl. No. 12/425,824, filed Apr. 17, 2009, Shaohua Yang.
U.S. Appl. No. 12/556,180, filed Sep. 9, 2009, Tan et al.
U.S. Appl. No. 12/712,136, filed Feb. 24, 2010, Mathew et al.
U.S. Appl. No. 12/901,791, filed Oct. 11, 2010, Yang, Shaohua.
U.S. Appl. No. 13/213,789, filed Aug. 19, 2011, Jin, Ming et al.
Bagul, Y.,G.: "Assessment of current health and remaining useful life of hard disk drives" [online] Jan. 1, 2009 [retrieved on Oct. 14, 2010] Retrieved from the internet:<URL:htt.
Galbraith et al, "Iterative Detection Read Channel Technology in Hard Disk Drives" [online] Oct. 1, 2008 [retrieved on Oct. 1, 2008] Retrieved from Internet:<URL: http://www.hit.
Kavcic et al., "A Signal-Dependent Autoregressive Channel Model", IEEE Transactions on Magnetics, vol. 35, No. 5, Sep. 1999 pp. 2316-2318.
ECMA: Standardizing Information and Communication Systems: "Standard ECMA-272: 120 mm DVD Rewritable Disk (DVD-RAM)" Standard ECMA, , No. 272, Feb. 1, 1998, pa.

* cited by examiner

SYSTEMS AND METHODS FOR QUALITATIVE MEDIA DEFECT DETERMINATION

BACKGROUND OF THE INVENTION

The present invention is related to systems and methods for transferring information, and more particularly to systems and methods for determining problems related to a medium associated with a data transfer.

Various data transfer systems have been developed including storage systems, cellular telephone systems, radio transmission systems. In each of the systems data is transferred from a sender to a receiver via some medium. For example, in a storage system, data is sent from a sender (i.e., a write function) to a receiver (i.e., a read function) via a storage medium. The effectiveness of any transfer is impacted by any defects associated with the transfer medium. In some cases, data loss caused by defects in the transfer medium can make recovery of data from the transfer medium difficult even for data received from non-defective areas or times.

Various approaches have been developed for identifying defects in the transfer medium. Such approaches provide a general ability to identify defects, but in many cases are inaccurate. This inaccuracy may, for example, fail to identify a media defect when the defect is not sufficiently pronounced. In the best case, this inaccuracy limits the effectiveness of any defect identification. In the worst case, inaccurate defect detection may actually hamper the data recovery process.

Hence, for at least the aforementioned reasons, there exists a need in the art for advanced systems and methods for recovering data from a storage medium.

BRIEF SUMMARY OF THE INVENTION

The present invention is related to systems and methods for transferring information, and more particularly to systems and methods for determining problems related to a medium associated with a data transfer.

Various embodiments of the present invention are disclosed that include a media defect detector circuit. The media defect detector circuit is operable to compare a data input derived from a medium against at least a first defect level to yield a first level output, and a second defect level to yield a second level output; and provide a combination of the first level output and the second level output as a defect quality output. A value of the defect quality output corresponds to a likelihood of a defect of the medium.

In some instances of the aforementioned embodiments, the media defect circuit is further operable to: declare a marginal media defect based at least in part upon a first value of the defect quality output; and declare a pronounced media defect based at least in part upon a second value of the defect quality output. In one or more instances of the aforementioned embodiments, the data processing circuit is implemented as part of a storage device, while in other instances, the data processing circuit is implemented as part of a receiving device. In some instances of the aforementioned embodiments, the data processing circuit is implemented as part of an integrated circuit.

In various instances of the aforementioned embodiments, the data processing circuit further includes: a data detector circuit, a data decoder circuit, and a gating circuit. The data detector circuit is operable to apply a data detection algorithm to the data input to yield a detected output. The data decoder circuit is operable to apply a data decode algorithm to a decode input to yield a decoded output. The gating circuit is operable to receive the detected output and to provide one of the detected output and a modified version of the detected output as the decode input based at least in part on an erasure output from the media defect detector circuit. In some such cases, the media defect detector circuit is operable to assert the erasure output at a first assertion level when the data input is less than the first defect level and less than the second defect level, and to assert the erasure output at a second assertion level when the data input is greater than the first defect level and less than the second defect level. In particular cases, the gating circuit is operable to provide the detected output as the decode input when the erasure output is asserted at the second assertion level, and to provide the modified version of the detected output as the decode input when the erasure output is asserted at the first assertion level.

In some instances of the aforementioned embodiments, the data decoder circuit is further operable to indicate failure of convergence of the data input. In such instances, the media defect detector circuit is operable to declare a media defect based at least upon the defect quality output and the indication of the failure of convergence of the data input. In particular instances of the aforementioned embodiments, the media defect detector circuit is operable to: assert the erasure output at a first assertion level when the data input is less than the first defect level and less than the second defect level; assert the erasure output at a second assertion level when the data input is greater than the first defect level and less than the second defect level; and declare the media defect based at least upon the defect quality output and the indication of the failure of convergence of the data input when the data input is greater than the first defect level and less than the second defect level. In some such instances, the declared media defect is a marginal media defect.

Other embodiments of the present invention provide methods for data processing that include: receiving a data input derived from a medium; comparing the data input against a first defect level to yield a first level output; comparing the data input against a second defect level to yield a second level output; and providing a combination of the first level output and the second level output as a defect quality output. In such cases, a value of the defect quality output corresponds to a likelihood of a defect of the medium.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for transferring information, and more particularly to systems and methods for determining problems related to a medium associated with a data transfer.

Various embodiments of the present invention provide for media defect detection with a qualitative measurement that allows for later evaluation of potential media defects. As an example, a qualitative media defect detector circuit may be utilized to compare a received input against a range of defect thresholds to yield a plurality of level outputs. These level outputs may then be compared against a defect quality threshold to determine whether a media defect is to be declared. A media defect may be automatically declared where the plurality of level outputs indicate that the amplitude is below a first level (i.e., a pronounced media defect). In contrast, a media defect may not be automatically declared where the plurality of level outputs indicate that the amplitude is above the first level and below a second level (i.e., a marginal defect). In this case, a media defect may only be declared where the data processing fails to converge or where one or more additional attempts to read the same area result in similar marginal readings.

Figure 1:
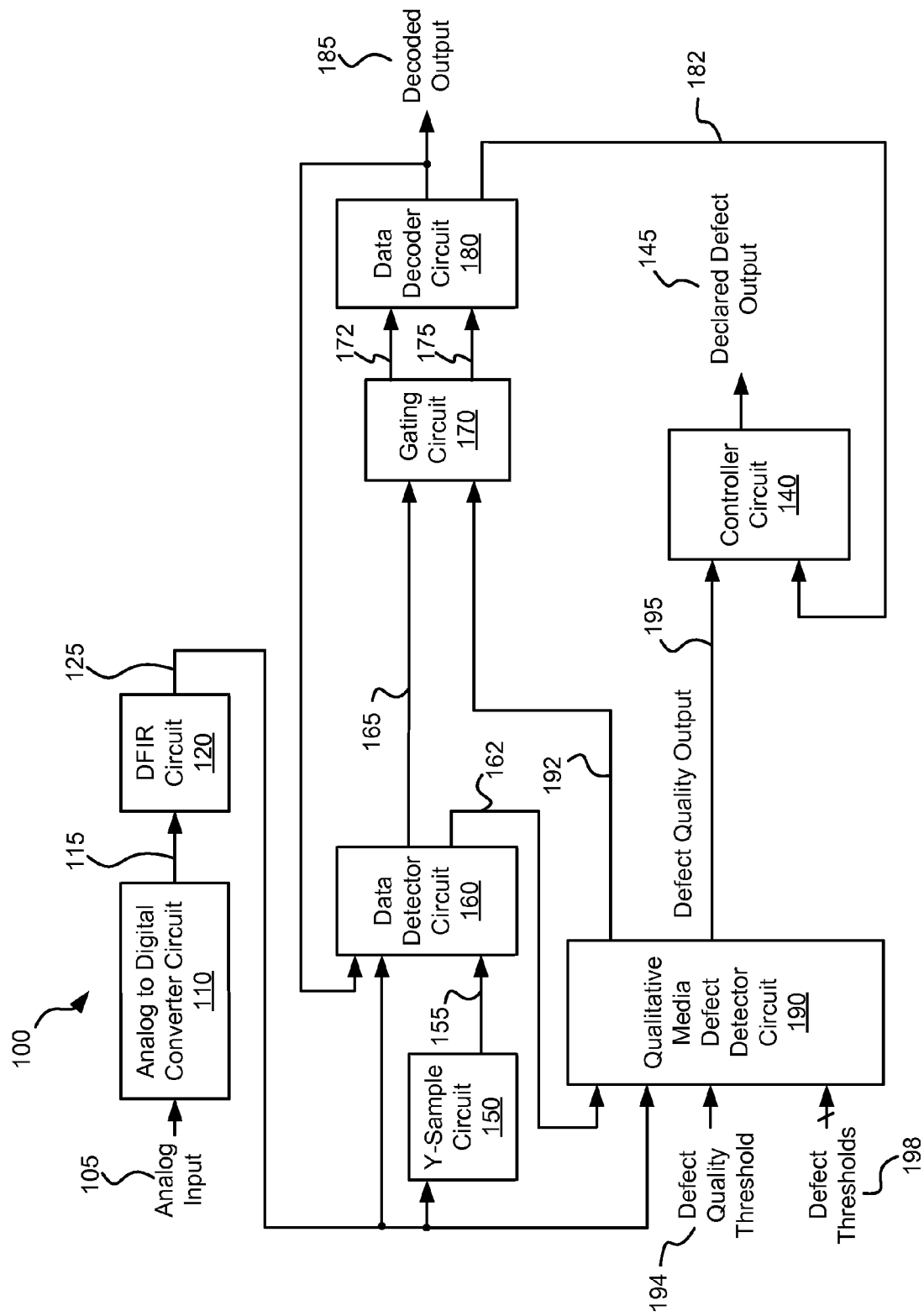
FIG. 1 depicts a data processing system including a qualitative media defect detector circuit in accordance with some embodiments of the present invention.

Turning to FIG. 1, a data processing system 100 including a qualitative media defect detector circuit 190 is shown in accordance with some embodiments of the present invention. Data processing circuit 100 includes an analog to digital conversion circuit 110 that receives an analog input 105 and provides a series of corresponding digital samples 115. Analog input 105 is derived from, for example, a storage medium or a data transmission channel. Based upon the disclosure provided herein, one of ordinary skill in the art will recognize a variety of sources of analog input 105. Analog to digital converter circuit 110 may be any circuit known in the art that is capable of converting an analog signal into a series of digital values representing the received analog signal. Digital samples 115 are provided to a digital finite impulse response circuit 120 that operates to equalize the received digitals samples 115 to yield an equalized output 125. Based upon the disclosure provided herein, one of ordinary skill in the art will recognize a variety of equalizer circuits that may be used in place of digital finite impulse response circuit 120 in accordance with different embodiments of the present invention.

Equalized output 125 is provided to both a data detector circuit 160 and a Y-sample circuit 150. Y-sample circuit 150 stores equalized output 125 as buffered data 155 for use in subsequent iterations through data detector circuit 160. Data detector circuit 160 may be any data detector circuit known in the art that is capable of producing a detected output 165 that is provided to a gating circuit 170. As some examples, data detector circuit 160 may be, but not limited to, a Viterbi algorithm detector circuit or a maximum a posteriori detector circuit as are known in the art. Based upon the disclosure provided herein, one of ordinary skill in the art will recognize a variety of data detector circuits that may be used in relation to different embodiments of the present invention. In addition, data detector circuit 160 provides an iteration indication output 162 to qualitative media defect detector circuit 190.

Detected output 165 includes both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention. Gating circuit 170 is operable to receive detected output 165 and to provide both hard decisions 172 and corresponding soft decisions 175 depending upon an assertion level of an erasure output 192. In particular, where erasure output 192 is asserted such that no media defect is indicated, the hard decisions and soft decisions included in detected output 165 are passed directly through as hard decisions 172 and soft decisions 175. Alternatively, where erasure output 192 is asserted such that a media defect is indicated, the soft decisions included in detected output 165 are set to zeros (i.e., erased), and the zero values are provided as soft decisions 175. In this way, the effect of data from defective regions of the media from which analog input 105 is derived is mitigated by sufficiently reducing the credibility of the data from the defective region allowing the credibility from other non-defective regions to dictate the downstream data decoding process.

Hard decisions 172 and soft decisions 175 are provided to a data decoder circuit 180 that applies a decoding algorithm to the received input in an attempt to recover originally written data. The data decoder circuit may be any data decoder circuit known in the art that is capable of applying a decoding algorithm based on both soft decisions and hard decisions. Data decoder circuit 180 may be, but is not limited to, a low density parity check decoder circuit or a Reed Solomon decoder circuit as are known in the art. In some particular cases, performing data decoding on the 2T waveform is done using syndrome based decoding. Such syndrome based decoding based upon a known pattern (e.g., a 2T pattern) involves computing an H matrix. To decode a received/detected bit sequence, a syndrome is computed based upon the detected bits. Decoding fails if there is a difference between the two syndromes. In such cases, all of the decoding would be syndrome based decoding. Based upon the disclosure provided herein, one of ordinary skill in the art will recognize a variety of data decoder circuits that may be used in relation to different embodiments of the present invention.

Data decoder circuit 180 provides a decoded output 185 representing the results of applying the decoding algorithm. Decoded output 185 may be passed back to data detector circuit 160 where it may be used to guide subsequent attempts to process the same data set available as buffered data 155. This process of passing a given data set through both data detector circuit 160 and data decoder circuit 180 is referred to as a "global iteration", and processing a given data set may involve one or more global iterations. In addition, each global iteration may include multiple passes through one or both of data detector circuit 160 and data decoder circuit 180 before the resulting data is passed to the next processing block (i.e., one or more iterations through data detector circuit 160 before detected output 165 is provided to gating circuit 170, or one or more iterations through data decoder circuit 180 before decoded output 185 is provided to data detector circuit 160). These iterations are referred to as "local iterations".

Qualitative media defect detector circuit 190 compares equalized output 125 with a number of defect thresholds 198 representing a range of input values to yield a internal plurality of level outputs. These level outputs may then be compared against a defect quality threshold 194 to determine whether a media defect is to be declared. Where the level outputs indicate that the amplitude of equalized output 125 is below a defect quality threshold 194 (i.e., a pronounced media defect) for a defined number of clock cycles, erasure output 192 is asserted indicating a media defect. The defined number of clock cycles may be programmable and is designed to avoid identification of a media defect where noise results in a temporary reduction in the amplitude of equalized output 125. The level outputs are maintained and provided as a defect quality output 195 that are provided to a controller circuit 140. In addition, controller circuit 140 receives a status 182 from decoder circuit 180. Status 182 indicates whether the currently processing data set converged, or whether one or more parity checks remain violated.

Where defect quality output 195 indicates that the amplitude of equalized output was greater than defect quality threshold 194 but below another programmable threshold and status 182 indicates that the decoding process failed to converge, or defect quality output 195 indicates that the amplitude of equalized output was less than defect quality threshold 194 (i.e., a marginal media defect), a media defect is declared by asserting a declared defect output 145. The following pseudo-code describes an operation of controller circuit 140:

```
If (Defect Quality Output 195 Indicates a Pronounced Media Defect){
    assert Declared Defect Output   // From a Pronounced Media Defect //
}
Else If (Defect Quality Output 195 Indicates a Marginal Media Defect){
    If (Status 182 Indicates a Failure to Converge){
        assert Declared Defect Output   // From a Marginal Media
        Defect //
    }
}
Else {
    de-assert Declared Defect Output
}
```

Figure 2:
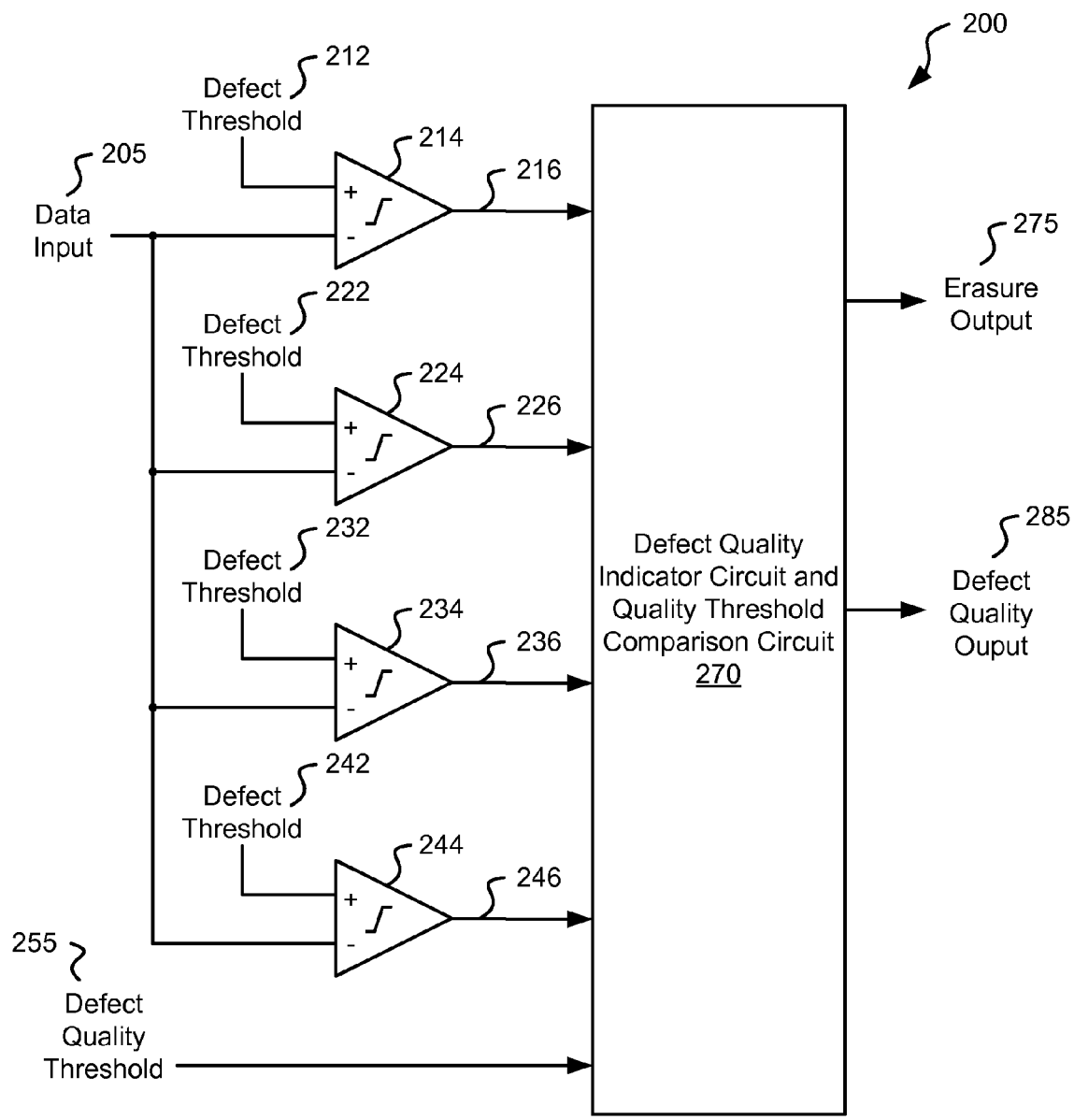
FIG. 2 depicts a qualitative media defect detector circuit in accordance with various embodiments of the present invention.

Turning to FIG. 2, a qualitative media defect detector circuit 200 is depicted in accordance with various embodiments of the present invention. Qualitative media defect detector circuit 200 may be used in place of qualitative media defect detector circuit 190 of FIG. 1. Where such is the case, equalized output 125 of FIG. 1 is provided as a data input 205 to qualitative media defect detector circuit 200, defect quality threshold 194 of FIG. 1 is provided as 255 is provided as defect quality threshold 255, defect thresholds 192 are provided as defect thresholds 212, 222, 232, 242, an erasure output 275 is provided as erasure output 192 to gating circuit 170 of FIG. 1, and defect quality output 285 is provided as defect quality output 195 to controller circuit 140 of FIG. 1.

Qualitative media defect detector circuit 200 includes four comparator circuits 214, 224, 234, 244 that each compare data input 205 against respective defect thresholds to yield level outputs. In particular, comparator circuit 214 compares data input 205 with defect threshold 212 to yield a level output 216. Where data input 205 is greater than defect threshold 212, level output 216 is set to a logic '1', otherwise, level output 216 is set to a logic '0'. Comparator circuit 224 compares data input 205 with defect threshold 222 to yield a level output 226. Where data input 205 is greater than defect threshold 222, level output 226 is set to a logic '1', otherwise, level output 226 is set to a logic '0'. Comparator circuit 234 compares data input 205 with defect threshold 232 to yield a level output 236. Where data input 205 is greater than defect threshold 232, level output 236 is set to a logic '1', otherwise, level output 236 is set to a logic '0'. Comparator circuit 244 compares data input 205 with defect threshold 242 to yield a level output 246. Where data input 205 is greater than defect threshold 242, level output 246 is set to a logic '1', otherwise, level output 246 is set to a logic '0'.

Level outputs 216, 226, 236, 246 are provided to a defect quality indicator circuit and quality threshold comparison circuit 279. Circuit 270 compares level outputs 216, 226, 236, 246 with defect quality threshold 255. Where the combinations of level outputs 216, 226, 236, 246 is greater than defect quality threshold 255, erasure output 275 is de-asserted so that an erasure is not performed. Alternatively, where the combinations of level outputs 216, 226, 236, 246 is less than or equal to defect quality threshold 255, erasure output 275 is asserted causing an erasure to be performed. For example, erasure output 275 may be asserted whenever all of level outputs 216, 226, 236, 246 are set at a logic '0'. Based upon the disclosure provided herein, one of ordinary skill in the art will recognize other values for defect quality threshold 255 that would result in assertion of erasure output 255 at different levels.

In addition, a composite of level outputs 216, 226, 236, 246 is provided as defect quality output 285. The composite may be, for example, a number between zero and four indicating the assertion level of level outputs 216, 226, 236, 246. The following table demonstrates such an example:

| Level Outputs 214, 224, 234, 244 | Defect Quality Output |
|---|---|
| '0000' | '000' |
| '0001' | '001' |
| '001X' | '010' |
| '01XX' | '011' |
| '1XXX' | '100' |

Based upon the disclosure provided herein, one of ordinary skill in the art will recognize a variety of composite outputs that may be made of level outputs 216, 226, 236, 246 to be provided as quality output 285. In some cases, level outputs 216, 226, 236, 246 are provided as quality outputs 285 without modification.

It should be noted that while qualitative media defect detector circuit 200 is shown to include four comparators and corresponding defect thresholds and level outputs that two or more comparators, defect thresholds, and level outputs may be used in different embodiments of the present invention. Where more comparators are used, the granularity in determining marginal defects is decreased at the cost of additional circuitry. In contrast, the granularity in determining marginal defects is increased while the cost of circuitry is decreased.

Figure 3A:
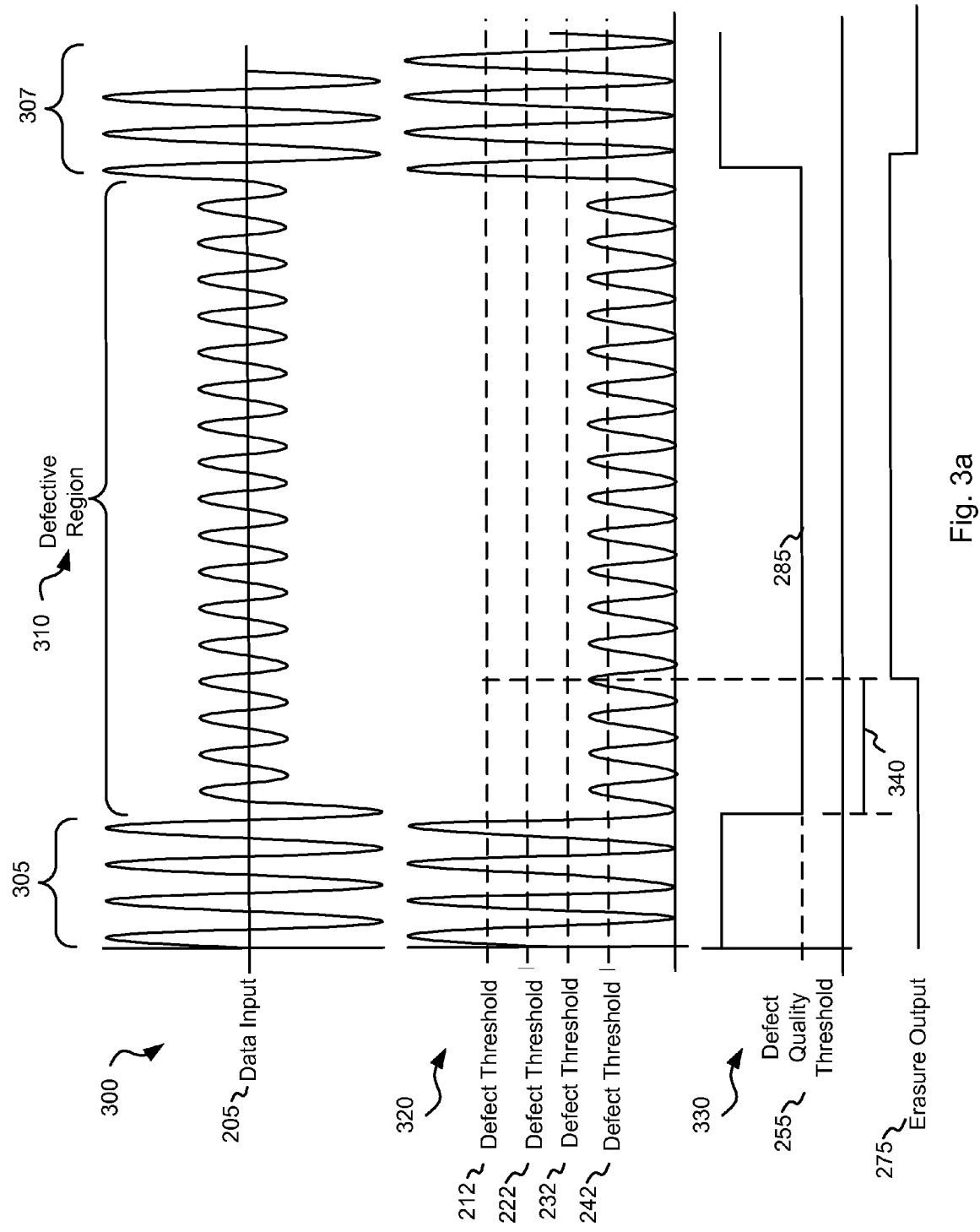
FIG. 3a is a graphical diagram showing operation of a qualitative media defect detector in accordance with some embodiments of the present invention where the detected media defect is pronounced.

Turning to FIG. 3a, a graphical diagram 300 depicts operation of qualitative media defect detector circuit 200 based on example inputs that include a pronounced media defect. In particular, a timing diagram shows an example data input 205 including periods where data is received from a non-defective medium (periods 305, 307), and a period 311 where data is received from a defective medium. A timing diagram 320 depicts the absolute value of data input 205 in relation to defect thresholds 212, 222, 232, 242. In this case, where a pronounced defect exists, the amplitude of data input 205 is less than 212, 222, 232, but greater than level threshold 242. In this situation, as shown in timing diagram 330, the value of defect quality output 285 drops from a relatively high level to a level that equals defect quality threshold 255. After a defined period 340 over which defect quality output 285 equals or is less than defect quality threshold 255, erasure output 275 is asserted. The defined period may be programmable.

Figure 3B:
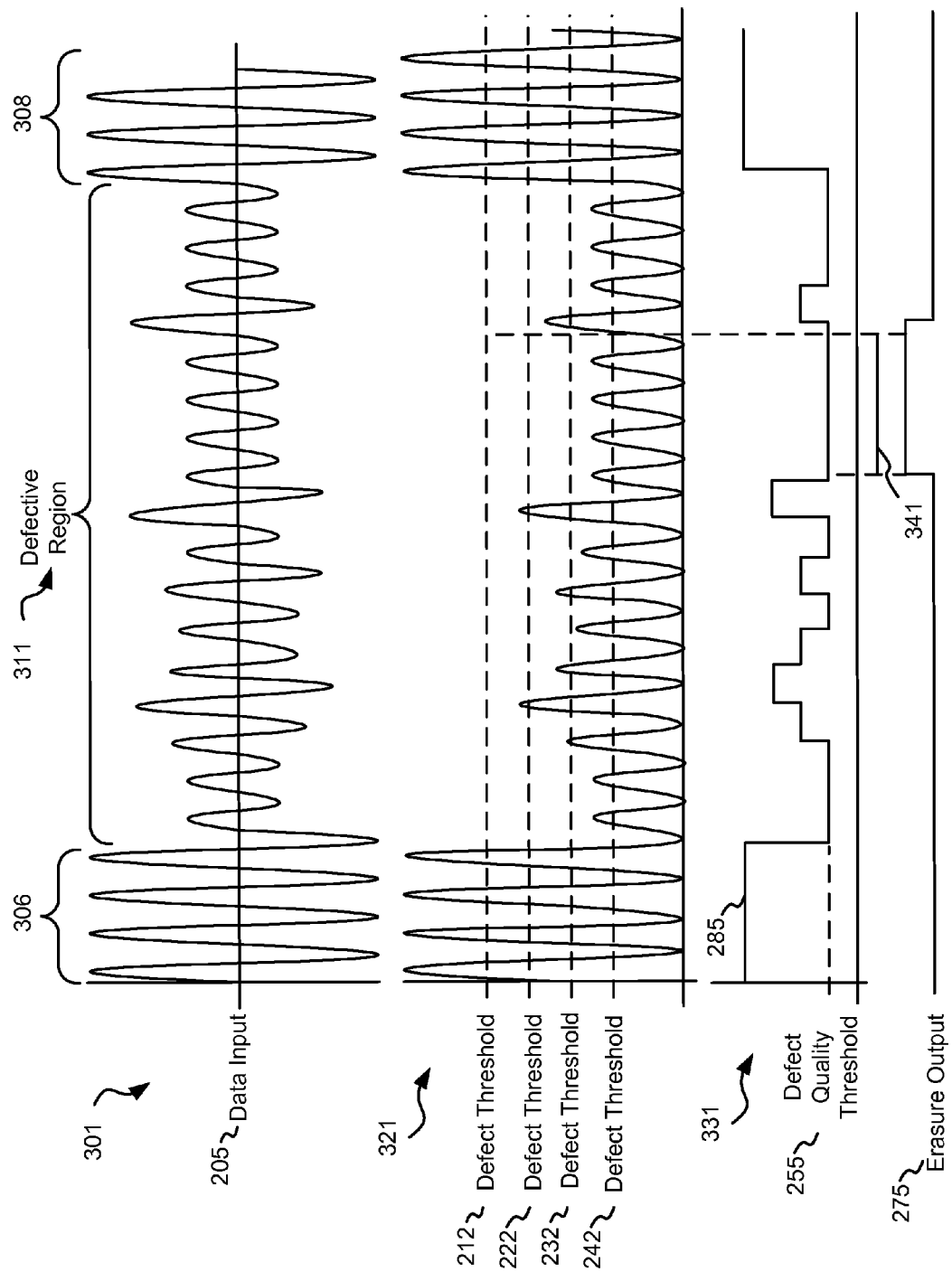
FIG. 3b is a graphical diagram showing operation of a qualitative media defect detector in accordance with some embodiments of the present invention where the detected media defect is marginal.

Turning to FIG. 3b, a graphical diagram 301 depicts operation of qualitative media defect detector circuit 200 based on example inputs that include a marginal media defect. In particular, a timing diagram shows an example data input 205 including periods where data is received from a non-defective medium (periods 306, 308), and a period 311 where data is received from a defective medium. A timing diagram 321 depicts the absolute value of data input 205 in relation to defect thresholds 212, 222, 232, 242. In this case, where a marginal defect exists, the amplitude of data input 205 is intermittently less than defect threshold 232 and greater than defect threshold 232. In this case, while the media defect is real, it is not sustained for a time period 341 sufficient to declare a defect (i.e., as shown in timing diagram 331, defect quality output 285 does not become equal to or less than defect quality threshold for a sufficient period of time to be declare a defect). In this situation, erasure output 275 is eventually asserted, but the early part of the defective region 310 is not identified. However, defect quality output 285 is provided as an output. In this case, where the data processing fails to converge, defect quality output 285 may be stored and reconsidered to determine the possibility of a marginal defect which can then be identified. It should be noted that other thresholds may be used. For example, a defect may be declared whenever either defect threshold 232 or defect threshold 242 is exceeded.

Figure 4:
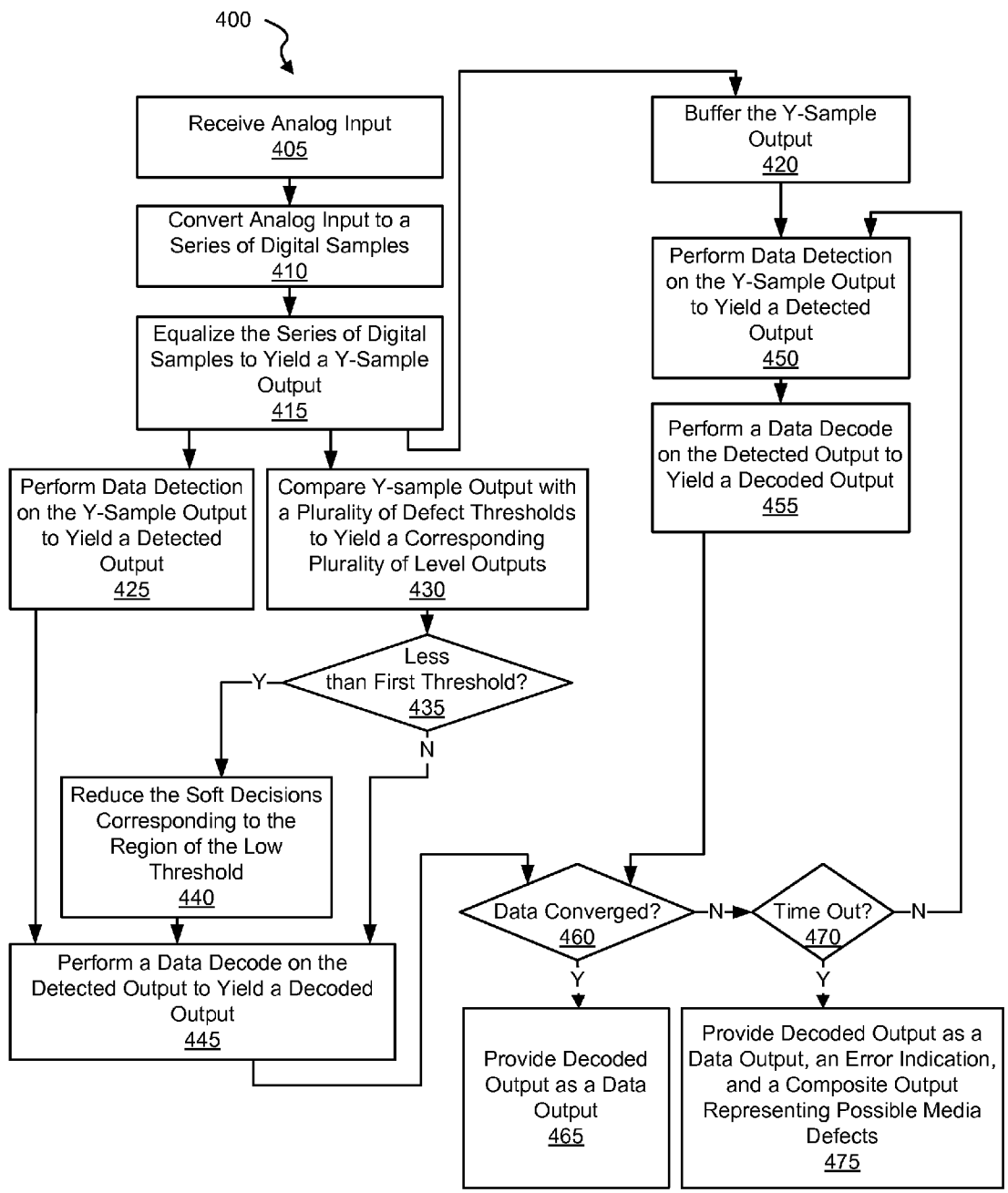
FIG. 4 is a flow diagram showing a process in accordance with some embodiments of the present invention for qualitative media defect detection.

Turning to FIG. 4, a flow diagram 400 depicts a process in accordance with some embodiments of the present invention for qualitative media defect detection. Following flow diagram 400, an analog input is received (block 405). The analog input may be derived, for example, a storage medium or a data transmission channel. Based upon the disclosure provided herein, one of ordinary skill in the art will recognize a variety of sources of the analog input. The analog input is converted to a series of digital samples (block 410). This conversion may be done using an analog to digital converter circuit or system as are known in the art. Of note, any circuit known in the art that is capable of converting an analog signal into a series of digital values representing the received analog signal may be used. The resulting digital samples are equalized to yield a Y-sample output (block 415). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention. The resulting Y-sample output is buffered to a memory (block 420).

A data detection algorithm is applied to the Y-sample output to yield a detected output (block 425). As just two examples, the data detection algorithm may be a maximum a posterior data detection algorithm or a Viterbi algorithm detection as are known in the art. Based upon the disclosure provided herein, one of ordinary skill in the art will recognize a variety of data detection algorithms that may be used in relation to different embodiments of the present invention. The detected output includes both hard decisions and soft decisions.

In addition, the Y-sample output is compared with a plurality of defect thresholds to yield a corresponding number of level outputs (block 430). In some cases, four different defect thresholds are used. In other cases, two, three, or more than four defect thresholds are used with a corresponding change in the number of level outputs. In various cases, one or more of the defect thresholds are programmable. It is determined if the Y-sample outputs are less than a first threshold value for a given period of time (block 435). In some cases, the first threshold is equal to the lowest of the defect thresholds. In various cases, the first threshold is programmable along with the period of time over which the threshold is measured. Where the Y-sample outputs are less than the threshold for the defined period (block 435), the soft decisions corresponding to the detected outputs around the area where the low threshold is identified are reduced to minimize their impact on a downstream data processing (block 440).

A data decode process is applied to the detected output with either the original soft decision data or soft decision data modified by block 440 to yield a decoded output (block 445). As just two examples, the data decode algorithm may be a low density parity check decode algorithm or a Reed Solomon decode algorithm as are known in the art. Based upon the disclosure provided herein, one of ordinary skill in the art will recognize a variety of data decode algorithms that may be used in relation to different embodiments of the present invention.

It is then determined whether the data decode algorithm converged (e.g., the number of remaining violated checks is zero or below a defined threshold) (block 460). Where the data converged (block 460), the decoded output is provided as a data output (block 465) and the processing is complete for that particular y-sample output. Alternatively, where the data failed to converge (block 460), it is determined whether a maximum number of global iterations have been performed (i.e., whether a time out condition has been achieved) (block 470). Where the time out condition has been achieved (block 470), the decoded output is provided as a data output along with an error indication noting that the data failed to converge and a composite output representing any possible media defects (block 475). The composite output may be the output of the four level outputs combined together into a single value output, or may simply be the four level outputs.

Alternatively, where the time out condition has not been met (block 470), a subsequent data detection is performed on the Y-sample data that was buffered (block 420) using the decoded output (block 445) as a guide to yield a detected output (block 450). This detection process may use the same detection algorithm performed in block 425. The detected output is then provided to a data decoder where a decoder algorithm is applied to yield a decoded output (block 455). At this juncture, the processes of blocks 460, 465, 470, 475, 450 and 455 are repeated until the data processing for the particular data set completes either through convergence or time out. Where the process completes through time out (block 470). The composite output can be used to make a determination of whether a marginal media defect may have led to the failed read, and steps can be taken to avoid the problem in the future and/or to retrieve whatever data may be salvaged from the defective region.

Figure 5:
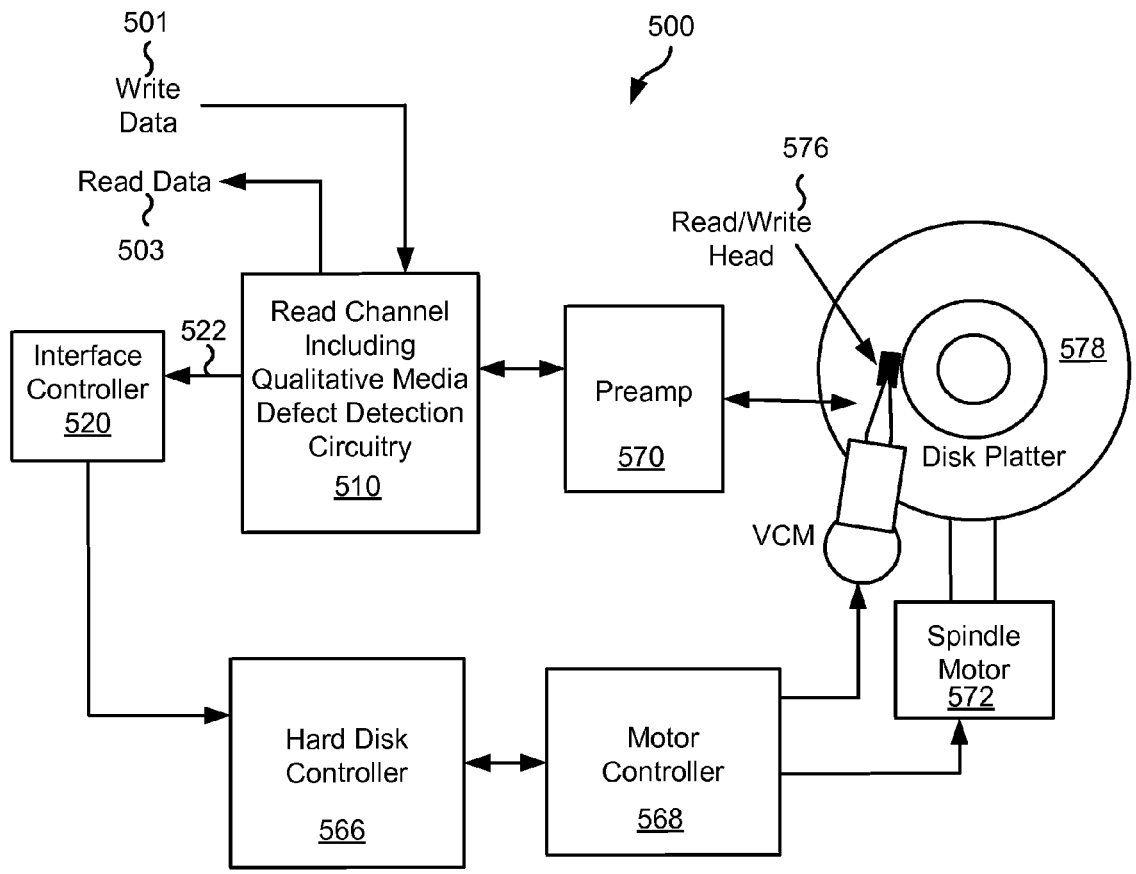
FIG. 5 shows a storage device including a read channel having qualitative media defect detection circuitry in accordance with one or more embodiments of the present invention.

FIG. 5 shows a storage system 500 including a read channel circuit 510 with qualitative media defect detection circuitry in accordance with some embodiments of the present invention. Storage system 500 may be, for example, a hard disk drive. Storage system 500 also includes a preamplifier 570, an interface controller 520, a hard disk controller 566, a motor controller 568, a spindle motor 572, a disk platter 578, and a read/write head assembly 576. Interface controller 520 controls addressing and timing of data to/from disk platter 578. The data on disk platter 578 consists of groups of magnetic signals that may be detected by read/write head assembly 576 when the assembly is properly positioned over disk platter 578. In one embodiment, disk platter 578 includes magnetic signals recorded in accordance with either a longitudinal or a perpendicular recording scheme.

In a typical read operation, read/write head assembly 576 is accurately positioned by motor controller 568 over a desired data track on disk platter 578. Motor controller 568 both positions read/write head assembly 576 in relation to disk platter 578 and drives spindle motor 572 by moving read/write head assembly to the proper data track on disk platter 578 under the direction of hard disk controller 566. Spindle motor 572 spins disk platter 578 at a determined spin rate (RPMs). Once read/write head assembly 578 is positioned adjacent the proper data track, magnetic signals representing data on disk platter 578 are sensed by read/write head assembly 576 as disk platter 578 is rotated by spindle motor 572. The sensed magnetic signals are provided as a continuous, minute analog signal representative of the magnetic data on disk platter 578. This minute analog signal is transferred from read/write head assembly 576 to read channel circuit 510 via preamplifier 570. Preamplifier 570 is operable to amplify the minute analog signals accessed from disk platter 578. In turn, read channel circuit 510 decodes and digitizes the received analog signal to recreate the information originally written to disk platter 578. This data is provided as read data 503 to a receiving circuit. As part of decoding the received information, read channel circuit 510 processes the received signal to determine whether a media defect is detected. This media defect detection may be done using circuits similar to those described above in relation to FIGS. 1-2, and/or may operate similar to the method described above in relation to FIG. 4. When a defect is identified, a declared defect output 522 is provided to interface controller 520 indicating the location of the media defect, and interface controller 520 marks the defective region as unusable. A write operation is substantially the opposite of the preceding read operation with write data 501 being provided to read channel circuit 510. This data is then encoded and written to disk platter 578.

It should be noted that storage system 500 may be integrated into a larger storage system such as, for example, a RAID (redundant array of inexpensive disks or redundant array of independent disks) based storage system. It should also be noted that various functions or blocks of storage system 500 may be implemented in either software or firmware, while other functions or blocks are implemented in hardware.

Figure 6:
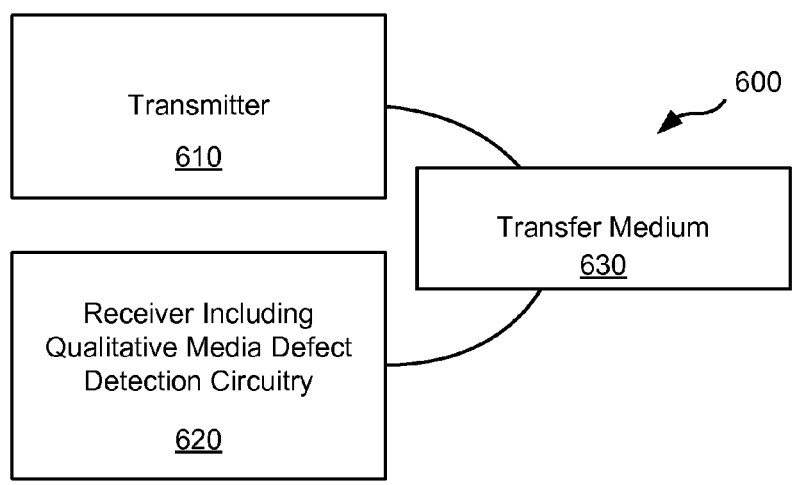
FIG. 6 shows a data transmission device including a receiver having qualitative media defect detection circuitry in accordance with some embodiments of the present invention

Turning to FIG. 6, a data transmission system 600 including a receiver with qualitative media defect detection circuitry is shown in accordance with some embodiments of the present invention. Data transmission system 600 includes a transmitter 610 that is operable to transmit encoded information via a transfer medium 630 as is known in the art. The encoded data is received from transfer medium 630 by receiver 620. Receiver 620 incorporates qualitative media defect detection circuitry that may be implemented similar to that discussed above in relation to FIGS. 1-2, and/or operate similar to that described above in relation to FIG. 4.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing circuit, the data processing circuit comprising:
   a media defect detector circuit operable to:
      compare a data input derived from a medium against at least a first defect level to yield a first level output, and a second defect level to yield a second level output; and
      provide a combination of the first level output and the second level output as a defect quality output, wherein a value of the defect quality output corresponds to a likelihood of a defect of the medium.

2. The data processing circuit of claim 1, wherein the media defect circuit is further operable to:
   declare a marginal media defect based at least in part upon a first value of the defect quality output; and
   declare a pronounced media defect based at least in part upon a second value of the defect quality output.

3. The data processing circuit of claim 1, wherein the data processing circuit further comprises:
   a data detector circuit operable to apply a data detection algorithm to the data input to yield a detected output;
   a data decoder circuit operable to apply a data decode algorithm to a decode input to yield a decoded output; and
   a gating circuit operable to receive the detected output and to provide one of the detected output and a modified version of the detected output as the decode input based at least in part on an erasure output from the media defect detector circuit.

4. The data processing circuit of claim 3, wherein the media defect detector circuit is operable to:
   assert the erasure output at a first assertion level when the data input is less than the first defect level and less than the second defect level, and
   assert the erasure output at a second assertion level when the data input is greater than the first defect level and less than the second defect level.

5. The data processing circuit of claim 4, wherein the gating circuit is operable to:
provide the detected output as the decode input when the erasure output is asserted at the second assertion level; and
provide the modified version of the detected output as the decode input when the erasure output is asserted at the first assertion level.

6. The data processing circuit of claim 3, wherein the data detector circuit is selected from a group consisting of: a Viterbi algorithm detector circuit, and a maximum a posteriori detector circuit.

7. The data processing circuit of claim 3, wherein the data decoder circuit is selected from a group consisting of: a low density parity check decoder circuit, and a Reed Solomon decoder circuit.

8. The data processing circuit of claim 3, wherein the data decoder circuit is further operable to indicate failure of convergence of the data input, and wherein the media defect detector circuit is operable to declare a media defect based at least upon the defect quality output and the indication of the failure of convergence of the data input.

9. The data processing circuit of claim 8, wherein the media defect detector circuit is operable to:
assert the erasure output at a first assertion level when the data input is less than the first defect level and less than the second defect level;
assert the erasure output at a second assertion level when the data input is greater than the first defect level and less than the second defect level; and
declare the media defect based at least upon the defect quality output and the indication of the failure of convergence of the data input when the data input is greater than the first defect level and less than the second defect level.

10. The data processing circuit of claim 9, wherein the declared media defect is a marginal media defect.

11. The data processing circuit of claim 1, wherein the data processing circuit is implemented as part of a device selected from a group consisting of: a storage device and a receiving device.

12. The data processing circuit of claim 1, wherein the data processing circuit is implemented as part of an integrated circuit.

13. A method for data processing, the method comprising:
receiving a data input derived from a medium;
comparing the data input against a first defect level using a comparator circuit to yield a first level output;
comparing the data input against a second defect level to yield a second level output; and
providing a combination of the first level output and the second level output as a defect quality output, wherein a value of the defect quality output corresponds to a likelihood of a defect of the medium.

14. The method of claim 13, wherein the method further comprises:
declaring a marginal media defect based at least in part upon a first value of the defect quality output; and
declaring a pronounced media defect based at least in part upon a second value of the defect quality output.

15. The method of claim 13, wherein the method further comprises:
applying a data detection algorithm to the data input to yield a detected output;
applying a data decode algorithm to a decode input to yield a decoded output;
generating an erasure output based at least in part on the first level output;
generating the decode input based at least in part on the erasure output, wherein the decode input is selected from a group consisting of: the detected output, and a modified version of the detected output.

16. The method of claim 13, wherein the method further comprises:
asserting the erasure output at a first assertion level when the data input is less than the first defect level and less than the second defect level;
asserting the erasure output at a second assertion level when the data input is greater than the first defect level and less than the second defect level;
providing the detected output as the decode input when the erasure output is asserted at the second assertion level; and
providing the modified version of the detected output as the decode input when the erasure output is asserted at the first assertion level.

17. The method of claim 15, wherein:
the data detection algorithm is selected from a group consisting of: a Viterbi algorithm detector circuit, and a maximum a posteriori detector circuit; and
the data decode algorithm circuit is selected from a group consisting of: a low density parity check decoder circuit, and a Reed Solomon decoder circuit.

18. The method of claim 15, wherein the method further comprises:
indicating a failure of the data decode algorithm to converge; and
declaring a media defect based at least upon the defect quality output and the indication of the failure of convergence of the data input.

19. The method of claim 18, wherein the method further comprises:
asserting the erasure output at a first assertion level when the data input is less than the first defect level and less than the second defect level;
asserting the erasure output at a second assertion level when the data input is greater than the first defect level and less than the second defect level; and
declaring the media defect based at least upon the defect quality output and the indication of the failure of convergence of the data input when the data input is greater than the first defect level and less than the second defect level.

20. A storage device, the storage device comprising:
a storage medium;
a head assembly disposed in relation to the storage medium and operable to provide a sensed signal corresponding to information on the storage medium;
a read channel circuit including:
an analog processing circuit operable to provide an analog signal corresponding to the sensed signal;
an analog to digital converter circuit operable to sample the analog signal to yield a series of digital samples;
an equalizer circuit operable to equalize the digital samples to yield an equalized input;
a media defect detector circuit operable to:
compare a data input derived from a medium against at least a first defect level to yield a first level output, and a second defect level to yield a second level output; and
provide a combination of the first level output and the second level output as a defect quality output, wherein a value of the defect quality output corresponds to a likelihood of a defect of the medium;

a data detector circuit operable to apply a data detection algorithm to the data input to yield a detected output;
a data decoder circuit operable to apply a data decode algorithm to a decode input to yield a decoded output; and
a gating circuit operable to receive the detected output and to provide one of the detected output and a modified version of the detected output as the decode input based at least in part on an erasure output from the media defect detector circuit.

* * * * *